United States Patent [19]

Sibley

[11] Patent Number: 5,443,649
[45] Date of Patent: Aug. 22, 1995

[54] SILICON CARBIDE CARRIER FOR WAFER PROCESSING IN VERTICAL FURNACES

[76] Inventor: Thomas Sibley, 5439 McCommas, Dallas, Tex. 75206

[21] Appl. No.: 343,824

[22] Filed: Nov. 22, 1994

[51] Int. Cl.⁶ .............................................. C23C 16/00
[52] U.S. Cl. .................................... 118/728; 118/500; 432/253
[58] Field of Search ................. 118/728, 500; 432/253

[56] References Cited

U.S. PATENT DOCUMENTS

| | | | |
|---|---|---|---|
| 3,951,587 | 4/1976 | Alliegro | 432/253 |
| 3,962,391 | 6/1976 | Dietze | 264/81 |
| 4,093,201 | 6/1978 | Dietze | 269/296 |
| 4,203,940 | 5/1980 | Dietze | 264/154 |
| 4,761,134 | 8/1988 | Foster | 432/253 |
| 4,978,567 | 12/1990 | Miller | 428/157 |
| 4,987,016 | 1/1991 | Ohto | 428/34.1 |
| 5,054,418 | 10/1991 | Thompson | 432/253 |
| 5,283,089 | 2/1994 | Bates | 428/344 |

FOREIGN PATENT DOCUMENTS 57-7923  1/1982  Japan .

*Primary Examiner*—Richard Bueker
*Attorney, Agent, or Firm*—Gary C. Honeycutt

[57] ABSTRACT

A single piece, high purity, full density semiconductor wafer holding fixture for holding a multiplicity of wafers and consisting essentially of chemical vapor deposited silicon carbide (CVD SiC). The wafer carrier is advantageous for the fabrication of electronic integrated circuits in a vertical furnace, where high temperatures and/or corrosive chemicals are present, where dimensional stability of the holder is advantageous to the process, and where introduction of contaminating elements is deleterious to the process. The method for making such an article comprises shaping a substrate, e.g. graphite, which on one surface has the form of the desired shape, said form comprising raised longitudinal sections to support the silicon wafers at the edges of the wafers, chemically vapor depositing a layer of silicon carbide onto the substrate, removing the substrate intact or by burning, machining, grinding, gritblasting and/or dissolving, and grinding the silicon carbide in any areas where a more precise dimension is required.

13 Claims, 3 Drawing Sheets

TYPICAL SECTION THROUGH
WAFER SLOTS
EXTENDED
VERTICAL CARRIER

VERTICAL CARRIER

SILICON CARBIDE CARRIER FOR WAFER PROCESSING IN VERTICAL FURNACES

CROSS-REFERENCE

This application is related to application Ser. No. 08/286,942, filed Aug. 8, 1994, for "Silicon Carbide Carrier For Wafer Processing And Method For Making Same".

FIELD OF THE INVENTION

The invention relates to fixtures or carriers ("boats") used in the manufacture of semiconductor devices such as diodes, transistors and integrated circuits. More particularly, the invention relates to silicon carbide carriers that are used in semiconductor fabrication processes that require the use of high temperatures and/or corrosive fluids. The carriers are particularly suited for use in chemical or thermal processing of semiconductor wafers, in vertically-oriented processing equipment, at ambient or elevated temperatures, in vacuum, gaseous or liquid processing environments.

BACKGROUND OF THE INVENTION

The requirements for cleanliness and the elimination of contaminants in the processing of semiconductor wafers are well documented; see, for example U.S. Pat. Nos. 3,951,541, 3,962,391, 4,093,201, 4,203,940, 4,761,134, 4,978,567, 4,987,016, and Japanese Patent Publication JP 50-90184. To maintain extremely high purity during processing, it is known that such fixtures should be totally free of contaminants, to the extent commercially feasible. It is also known that the carriers should be stable at elevated temperatures, and when subjected to corrosive or oxidizing conditions. Typical corrosive or oxidizing conditions to which the carriers should remain inert are set forth in U.S. Pat. Nos. 4,987,016 and 4,761,134.

Quartz has been and continues to be the most common material used for these components and fixtures. However, quartz has certain deficiencies, such as structural weakness at high temperatures, susceptibility to etching by commonly used acids, and a coefficient of thermal expansion that differs from that of certain materials which are deposited thereon during normal use.

The prior art discussed below addresses the construction of silicon carbide (SIC) boats which have thus far had the most commercial success—a porous SiC formed by casting. These references disclose the drawbacks of quartz, and the benefits of using SiC. They also disclose the drawbacks of the casting method of producing SiC boats. In order to avoid the deficiencies of porous SiC, prior art methods apply a SiC coating layer by chemical vapor deposition (CVD) over the cast SiC. However, an overcoat of CVD SiC does not completely eliminate the problems with porous SiC, since the coating can crack or chip, and thereby expose the porous SiC. Thus, a carrier that consists entirely of CVD SiC is preferred, thus avoiding the problems of porous SiC.

A number of attempts have been made to improve on quartz. The most suc- cessful is a porous silicon carbide infiltrated with silicon, disclosed in U.S. Pat. No. 3,951,587. The problem with such a carrier is that the silicon can etch out when exposed to commonly used cleaning solutions, e.g., strong acids, such as nitric acid, illustrated in U.S. Pat. No. 4,761,134. Other workers (see U.S. Pat. No. 4,761,134) propose to solve this problem by applying an impervious coating, generally a chemical vapor deposited silicon carbide (CVD SiC) coating on the surface of the silicon-filled silicon carbide, or on a porous silicon carbide that has not been filled with silicon (see U.S. Pat. No. 4,987,016). The drawback to these approaches is that any chip, break or crack in the coating will expose the undesirable substrate. U.S. Pat. No. 4,761,134 discusses this drawback as it pertains to CVD SiC applied on an unfilled porous SiC substrate. However, the discussion neglects to point out that a similar weakness is inherent in the approach disclosed and claimed in this reference. U.S. Pat. No. 5,283,089 discloses depositing silicon carbide or silicon nitride onto a silicon carbide or silicon nitride matrix to form wafer boats and other components for semiconductor diffusion furnaces.

The preferred approach is to fabricate the carrier entirely from CVD SiC. In this approach, there is no possibility of a silicon-filled or porous substrate being exposed. The CVD SiC fixture also has the advantage of being cleaner than the cast and sintered, or reaction-bonded SiC carriers disclosed in the previously cited references.

The following references describe carriers that are composed entirely of SiC. U.S. Pat. No. 4,978,567 describes a CVD SiC fixture for processing a single wafer at a time, in a furnace designed to do single wafer processing. There is a clear need for a boat for batch processing, capable of holding from 25 to 50 or more wafers. The carrier described and claimed in U.S. Pat. No. 4,978,567 cannot be used for batch processing.

Japanese Patent Application No. JP 50-90184 describes a hollow beam made of CVD SiC to hold wafers. However, this device requires that three or four such beams be joined together by a means of support at the ends. While the boat described in JP 50-90184 fulfills the need for a boat that can hold a plurality of wafers during semiconductor processing, the boat is fragile and relatively complex, and hence costly to manufacture. There is a need for a carrier that uses a single piece of SiC to achieve the same result, and thus is stronger and more economical.

Japanese Patent Application No. Sho 55-82427 discloses a boat consisting of a single piece of silicon carbide, formed by CVD on a graphite substrate. However, the the boat has a rectangular cross-section, which is undesirable because it requires an inefficient use of furnace space. Moreover, the rectangular design causes the mass of the boat to be unnecessarily large, which adds excess thermal inertia, and distorts the thermal pattern developed in the wafers during processing. In diffusion processes, for example, the excess thermal mass of a boat can cause temperature variations across the wafer area, and thereby alter diffusion patterns. Such variations cannot be offset by changes in process parameters. Still further, excess wafer area is covered by the slot walls or the connecting end members. In addition, the design includes partially enclosed areas that will distort gas flow patterns, and will increase the time required to exaust gases contained in such partially enclosed areas.

JP 55-82427 also fails to reveal the size of the boat, relative to the size of the wafers to be carried. If the height of the boat is small relative to the wafers, the slots will not provide adequate horizontal support to maintain the wafers in a vertical position. If the height of the boat is large relative to the diameter of the wafers, adequate horizontal support will be provided, but the walls of the slots will then cover an excessive area of each wafer.

U.S. Pat. Nos. 3,962,391, 4,093,201 and 4,203,940 (all assigned to Siemens) describe methods for making carriers which hold a number of wafers and are produced by depositing CVD silicon or CVD silicon carbide on a generally cylindrical graphite form. However, these patents describe carriers that are not suitable for the most widely used wafer processes. The devices described in U.S. Pat. Nos. 3,962,391 and 4,093,201 do not have means for holding the wafers apart, with a uniform gap between each of the wafers which is required in most batch semiconductor processes. U.S. Pat. No. 4,203,940 describes a carrier design that requires the grinding of slots in a silicon or silicon carbide form to provide means for holding the wafers apart with a gap between each pair of wafers. However, the design described in the latter patent allows only two narrow slots to hold each wafer.

Since two slots do not provide adequate wafer support, the industry has developed carriers having three or four vertical support points to hold each wafer. This is beneficial in the processing of silicon wafers, since it allows the wafers to be held in a more uniform and more parallel position, while minimizing the wafer area covered by the support points. Minimizing the wafer area covered by the support points of the holder maximizes the area of the wafer available for productive use. The general guidelines for the design of these widely used wafer carriers is described in the SEMI International Standards, published by Semiconductor Equipment and Materials International, Mountain View, Calif. The information contained in these standards is incorporated herein by reference.

The above patents are directed primarily to the problems connected with boats to be used in horizontal furnaces, wherein the wafers are supported in a vertical position. Instead, the present invention is directed to boats to be used in vertical furnaces, wherein the wafers are supported in a horizontal position. There is no known example of a boat that works well for use in both vertical and horizontal furnaces.

SUMMARY OF THE INVENTION

The present invention provides a CVD SiC wafer boat for use in vertically oriented furnaces for the manufacture of semiconductor devices, including features that eliminate the disadvantages of the above-described structures, and having the added advantage of conforming with the dimensional requirements for standard furnace systems.

The preferred carrier of the present invention consists of a single piece of nonporous SiC having a uniform bulk density in excess of 3.18 grams per cubic centimeter (99% of maximum theoretical density), and a purity of at least 99.99%. It is configured as a generally cylindrical shell section, portions of which extend outwardly beyond the radius of the wafers to be held, while at least two separated portions have a more limited outward extension, just within the radius of the wafers to be held. These latter portions include a plurality of orthogonal slots or grooves, to provide the necessary wafer separation and support. Since the carrier is to be used in a vertical position, the wafers are supported in a horizontal position, parallel to each other.

In a preferred embodiment, the carrier walls have a substantially uniform thickness, except for the areas where the wafer slots are located. The slot areas of the carrier wall are preferably about one-half to three-fourths as thick as the remaining walls. This feature minimizes thermal interaction between the wafers and the carrier; and also reduces the amount of wafer back-surface covered by the slot walls.

The carrier portions that include wafer slots need not be inwardly convex, nor is it necessary for such portions to have a single curvature. For example, such portions may be shaped to include flat and/or slightly concave central segments, such that the slots provided therein have a uniformly shallow depth, whereby only a minimum area of the wafer edges are covered, after insertion into the slots. In such a configuration the lower side of each slot provides vertical support for the wafer, and also provides alignment, to ensure a uniform parallel separation between adjacent wafers. In combination, the slots must be positioned to support each wafer at locations distributed along more than 180 degrees of wafer perimeter.

Both ends of the cylindrical section can be left open to form an open-ended carrier. Or, the ends can be closed to form a closed-end carrier. Open areas may be formed in the bottom or in the sides of the carrier, for gas circulation, or the draining of fluids used in cleaning or wet processing, or to reduce the mass of the carrier.

Another aspect of the invention is embodied in a process for making the carrier, which begins with the step of shaping the exterior of a substrate or mold, to provide the exact geometry required for the inside surface of the carrier. A graphite mold, for example, is shaped into the form of a cylindrical section, and is machined to provide at least two spaced-apart segments having a radius slightly less than the radius of wafers to be processed, while the remainder of the useful surface is provided with a radius slightly greater than the radius of the wafers to be processed. The mold is masked in areas where no deposition is desired.

Next, silicon carbide is formed on the mold surface, by chemical vapor deposition; and the resulting CVD shell is separated from the mold. Orthogonal slots or grooves are then machined into the reduced-radius portions, to provide wafer support locations. Other features of the boat may also be shaped by grinding, such as the length and height. Separation of the mold is usually achieved by destructively burning away the graphite, whereby only the deposited shell remains. Such grinding of the SiC may be performed before or after removing the mold, or a combination of before and after.

DETAILED DESCRIPTION OF THE INVENTION

Figure 1:
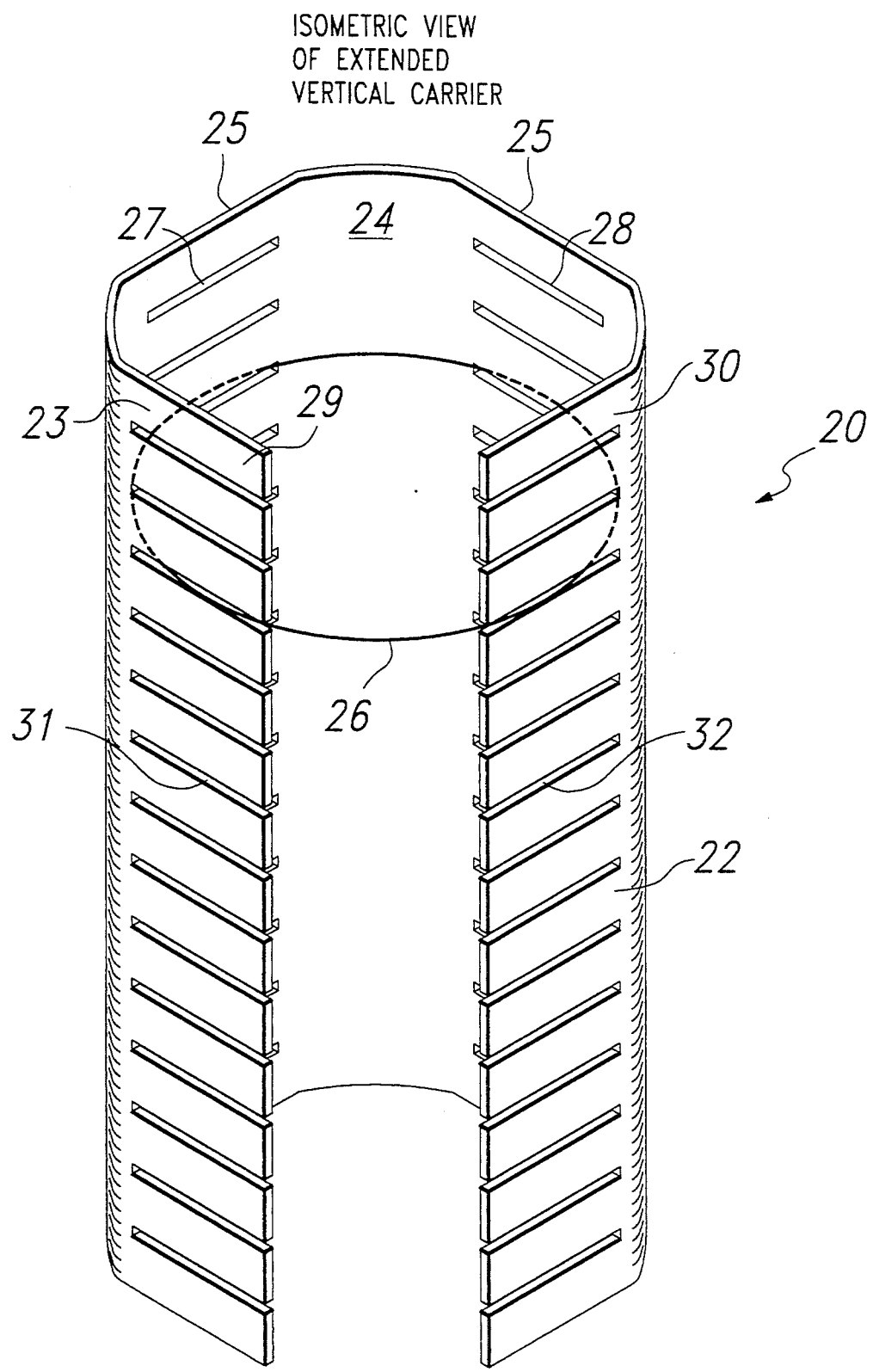
FIG. 1 is an isometric view of one embodiment of the present invention.
Figure 2:
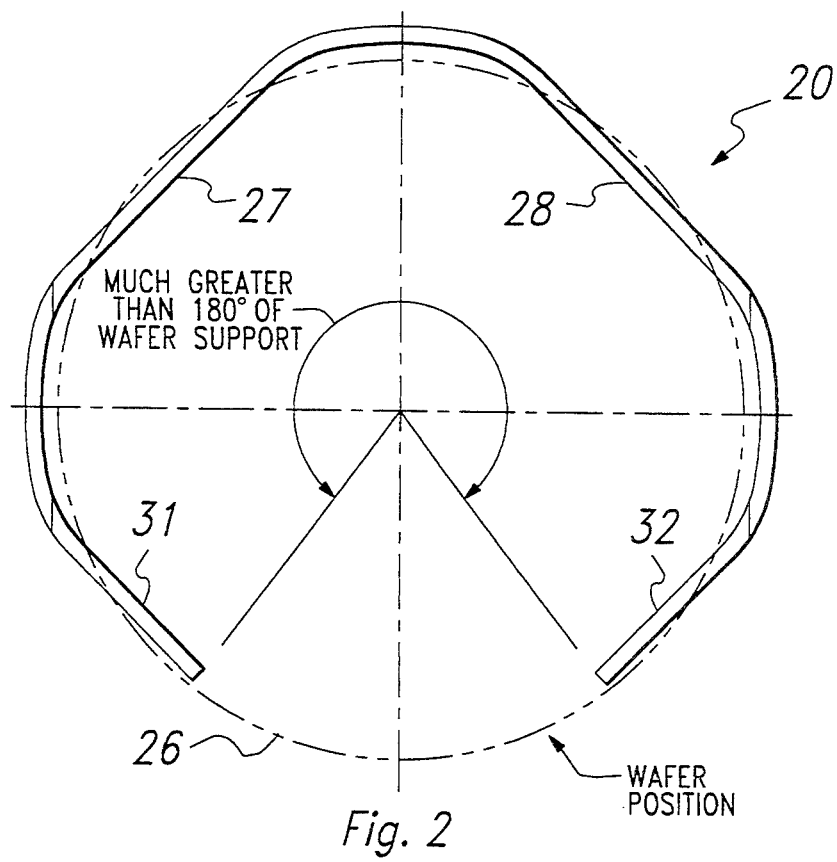
FIG. 2 is a cross-sectional view of the embodiment of FIG. 1.

Referring now to FIGS. 1 and 2, boat 20 is seen to comprise cylindrical shell section 22 of chemical vapor deposited SiC, having outwardly convex surface 23, inwardly concave surface 24, and flat surfaces 25. A portion of each of surfaces 25 lies inside the radius of wafer 26, and these surfaces include wafer slots 27 and 28, respectively. Surfaces 23 and 24 lie outside the radius of wafer 27 to be supported. The slotted portions of cylindrical section 22 subtend an arc, i.e. angle α, of about 181 degrees to 330 degrees. The specific geometry of those portions of the boat lying outside the wafer radius may take many forms, but generally have a curved surface with a single radius, except for a transition segment between those portions lying inside and outside the wafer radius, respectively. Windows may be provided in surfaces 23 and 24, for example, to permit the flow of process gases as well as to decrease the weight of boat 20 by removing unnecessary mass.

Boat 20 has two slot-containing flat surfaces 29 and 30 which extend partly within the wafer radius, and partly outside the wafer radius. Surfaces 29 and 30 are provided with a plurality of coplanar grooves or slots 31 and 32, respectively, into which the wafers are placed. The outermost extensions of slots 31 and 32 may lie slightly within the wafer radius, or slightly beyond the wafer radius.

The length, L, of slots 27 and 28 is calculated by determining the angle, θ, subtended by the slots. In the carriers of this invention, θ ranges from approximately 5° to approximately 50°.

FIG. 2 shows that the cross section of boat 20 includes three shell portions that lie outside the wafer radius, and four portions that lie inside the wafer radius. Coplanar slots 27, 28, 31 and 32 for supporting wafer 26 are provided in the portions that lie inside the wafer radius. The cross section must be configured so that the slots provide wafer support distributed over at least about 181 degrees of the perimeter of the wafer, so that gravity is not allowed to tilt or pivot the wafer, with respect to its diameter, or with respect to any other axis lying in the plane of the wafer. Of course, the amount of tilt would be small, because of the narrow width of each slot; but no tilt whatsoever should be allowed, because even a small departure from an exactly parallel relationship to the next adjacent wafer will severely affect the uniformity of the resulting deposition or diffusion.

Figure 3:
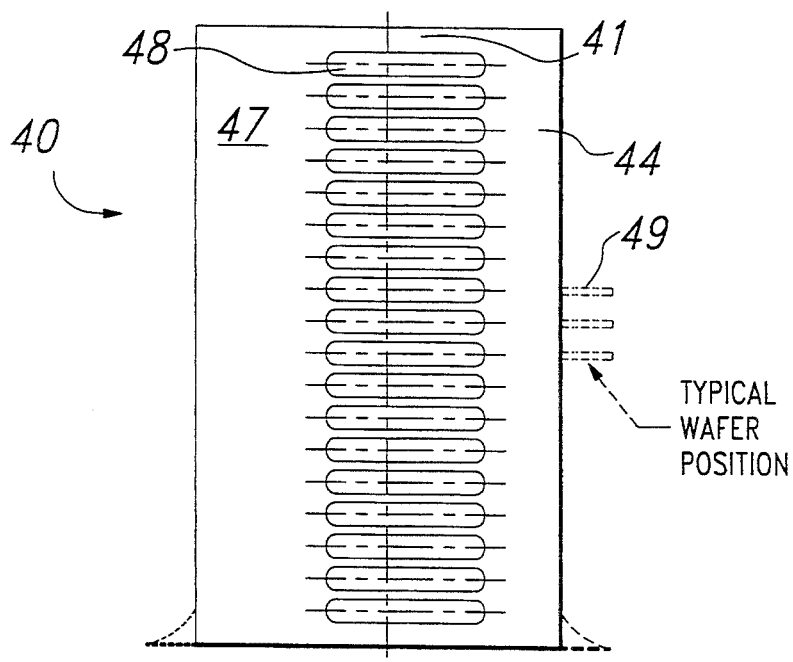
FIG. 3 is a side view of another embodiment of the invention.
Figure 4:
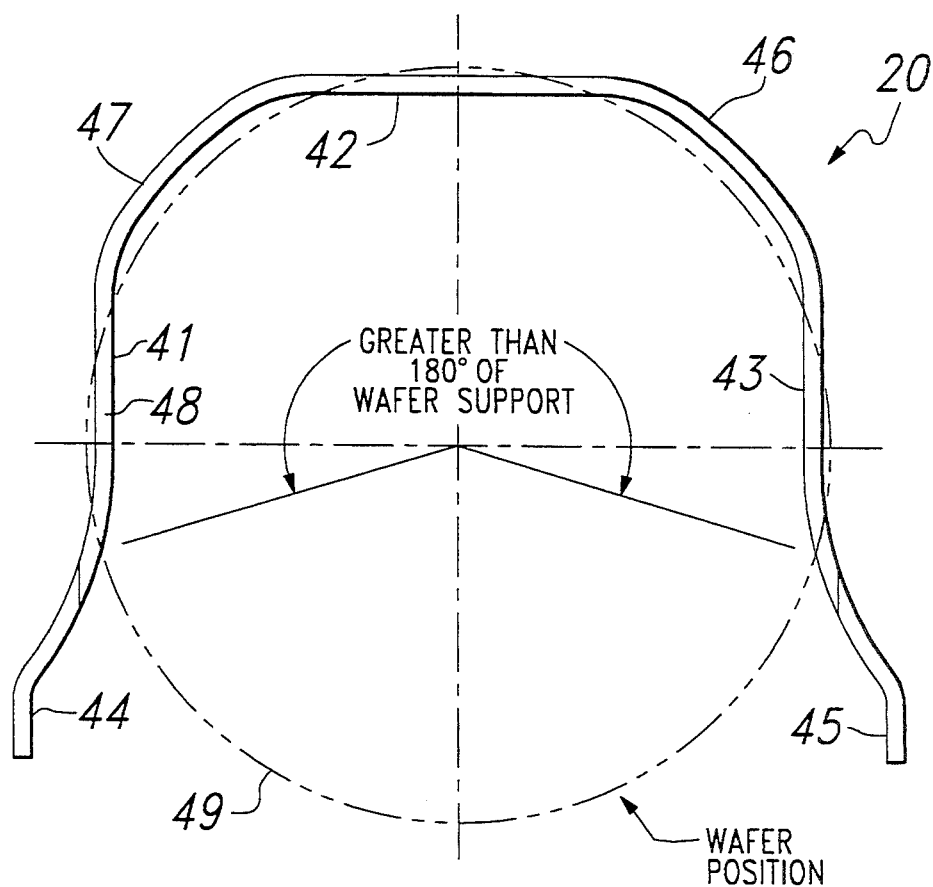
FIG. 4 is a cross sectional view of the embodiment of FIG. 3.

FIGS. 3 and 4 illustrate a side view and a cross-section, respectively, of boat 40, including surfaces 41 through 47. Slots 48 in surface 41 are equally spaced along the length of the cylindrical shell. Note that each wafer extends through a slot and beyond the wall of boat 40.

In FIG. 4, boat 40 is seen to include three surfaces 41, 42 and 43, within the diameter of wafer 49, and four surfaces (44 through 47) outside the radius of wafer 49. Each of surfaces 41, 42 and 43 has a row of slots equally spaced along the length of the cylindrical shell. Note that vertical support for each wafer, and precise alignment, is provided only by the lower side of each slot or groove. In addition, the boat includes segments 44 and 45 that extend outwardly well beyond the radius of the wafers.

The thickness of the CVD SiC, "t", should be minimized to reduce the thermal effects on the wafer, yet be thick enough to provide sufficient strength. In the preferred embodiment, this thickness may be in the range of about 0.020 inch to about 0.15 inch or higher. Further t may vary over the body of the boat, due to the nature of the CVD process and/or the requirements of the semiconductor manufacturing process. For instance, it is advantageous to have a thinner CVD SiC thickness at the support points to reduce the thermal effect of the boat on the wafers.

While the previously cited references generally refer to high temperature processing of semiconductor devices, the present invention includes the use of the CVD SiC component in operations that are performed at lower temperatures, including room temperature or below. Many cleaning or etching processes take place at these lower temperatures in corrosive or oxidative liquids or gases. In addition to, or in place of, elevated temperatures, these processes may use ultrasonic, plasma or other processing techniques to produce the desired effect on the wafers. CVD SiC wafer boats of the present invention are more stable in these corrosive environments.

PROCESS FOR MAKING CVD SiC BOAT

In the process of making one or more carriers of the present invention, one or preferably multiple layers of SiC are deposited onto a cylindrical form or mold. The desired geometric shape of the boat is machined into the form, which is preferably graphite or other suitable substrate material for coating with CVD SiC. In the preferred embodiment, the graphite is purified using a high temperature chlorine process or other suitable purification process to minimize the content of elements other carbon.

The geometric shape of the boat is then machined into the cylindrical form. A mask is placed over the backside of the form to prevent the deposition of SiC. Similarly, the ends of the form can also be masked to prevent closing the ends when an opened end boat is being made. Alternatively, these areas may be left unmasked, and the subsequently coated surfaces can be ground or cut away to expose the graphite form.

The form is placed in a furnace suitable for applying a CVD SiC coating and a layer of CVD SiC is applied to the form using a chemical vapor deposition process. Suitable processes for applying the CVD SiC coating are well known in the industry. The process generally involves heating the form to a suitable temperature, introducing a gas or combination of gases which contain silicon and carbon atoms, the gases being at, above or below atmospheric pressure and allowing the gases to react to form a silicon carbide layer on the form. The SiC layer may be deposited in single or multiple steps to achieve the desired thickness of silicon carbide. Examples of the suitable processes are described in the previously cited U.S. Pat. Nos. 3,962,391; 4,093,201; 4,203,940; and 4,978,567 and Japanese Patent Publication JP 50-90184.

The masks, if used, are removed to expose the underlying form or, if masks are not used, the CVD SiC coating is cut or ground away from the back and/or ends of the form. The graphite form is then removed intact, or removed by grinding, machining, burning, grit blasting, chemically dissolving or oxidizing, or other suitable method or combination of these methods.

The resulting CVD SiC form is ground, using diamond grinding wheels and/or other commercially available methods of shaping ceramics, to form the slots, to reduce the form to the desired length and width, and to form the base and/or other features of the boat. In some instances it may be advantageous to perform some or all of the grinding prior to removal of the graphite form from the CVD SiC.

In some designs, it may be advantageous to grind holes completely through the CVD SiC, for instance, to provide open areas for gas circulation, for insertion of lifting devices to transport the boats, for the draining of fluids used in cleaning or wet processing, or for other reasons.

The method of the invention produces a boat having essentially the desired final shape, upon completion of the deposition step. Thus, subsequent grinding is required for only 25% or less of the inner and outer surface areas. An especially unique feature of the process is the selective formation of relatively thinner walls in the areas of the carrier where slots are provided to support the wafers.

EXAMPLE

A mold is prepared by machining a hollow graphite cylinder, to shape its outer surface in the exact configuration required for the inner surfaces of the wafer carrier. Since the carrier is designed to hold wafers having a radius of 2.46", the graphite mold is selected to have a slightly larger outer radius of 2.72".

The graphite cylinder is purified at 2,000 degrees C. with chlorine gas in a purification reactor. The ends of the cylinder are then masked to prevent the coating gases from entering the interior of the cylinder. The masked cylinder is then placed in a CVD reactor and silicon carbide is deposited on the exposed surfaces by the pyrolysis of methyltrichlorosilane. The CVD reactor is designed to rotate the parts to promote uniform coating. The deposition is completed in two separate runs, and the cylinder inverted after the first run. The masks are removed from the ends of the cylinder.

The cylinder is ground, using diamond tools, to the desired length of 7.0 inches, and is then ground longitudinally to remove the front portion of the cylinder. The graphite is removed by combustion in air at 1600 degrees F. The wafer slots are ground into the carrier. The slots were 0.2" deep, 0.20" wide and on 0.3" centers. The exposed corners of the carrier are then chamfered using a diamond grinding wheel.

Without departing from the spirit and scope of this invention, one of ordinary skill in the art can make many other changes and modifications to the wafer carrier of the present invention to adapt it to specific usages and conditions. As such, these changes and modifications are properly, equitably, and intended to be, within the full range of equivalents of the following claims.

For example, the invention includes boats that have five, six, or more separate surfaces with slots or grooves therein for supporting wafers. Also, the invention includes boats having slots distributed over more than 180 degrees of the wafer circumference, even though the boat itself does not have a perimeter that subtends an arc of more than 180 degrees, with respect to the central axis of the boat. This is readily apparent for an embodiment wherein the slot configuration allows the wafers to be inserted deep enough into the boat, so that the center of each wafer is located between the rear of the boat and the central axis of the boat.

What is claimed is:

1. A carrier for holding semiconductor wafers, consisting of a single piece of silicon carbide having a purity of at least 99.99% and a bulk density of at least 3.18 grams per cubic centimeter, said carbide having the shape of a generally cylindrical shell section, portions thereof extending outwardly beyond the radius of the wafers to be held, and other portions thereof having a more limited outward extension, within the radius of the wafers to be held, the latter portions having a plurality of parallel slots therein to support the wafers, said slots being distributed around more than 180 degrees of the shell perimeter, such that the carrier is useful for supporting the wafers horizontally in a vertical furnace.

2. The carrier of claim 1 wherein said portions having a limited outward extension have a uniform curvature across their entire width, except for the shoulders thereof, where said portions merge with the main curvature of the carrier shell.

3. The carrier of claim 1 wherein said limited outward extensions have a non-uniform curvature, including a concave or flat portion shaped to minimize overlap of the slot walls with the wafers to be held therein.

4. The carrier of claim 1 wherein at least one open area is formed in said shell, in addition to said grooves.

5. The carrier of claim 1 wherein the slotted portions of said cylindrical shell subtend an arc of approximately 181 degrees to 330 degrees.

6. The carrier of claim 1 wherein said limited outward extensions subtend an arc ranging from approximately 5° to approximately 60°.

7. The carrier of claim 1 having two limited outward extensions.

8. The carrier of claim 1 having three limited outward extensions.

9. The carrier of claim 1 wherein the thickness of the shell is substantially uniform throughout, except for the slot walls, which are substantially thinner.

10. The carrier of claim 1 wherein the ends of the shell have fewer changes in curvature than the remaining portions of the shell, in order to provide relatively greater strength in the end portions.

11. A carrier for holding semiconductor wafers, consisting essentially of a single piece of silicon carbide having a purity of at least 99.99% and a bulk density of at least 3.18 grams per cubic centimeter, said carbide having the shape of a generally cylindrical shell section, portions thereof extending outwardly beyond the radius of the wafers to be held, and other portions thereof having a more limited outward extension, within the radius of the wafers to be held, the latter portions having a plurality of parallel slots therein to support the wafers, said slots being distributed around more than 180 degrees of the circumference of the wafers to be held, such that the carrier is useful for supporting wafers horizontally in a vertical furnace.

12. The carrier of claim 11 having from two to six or more limited outward extensions, each of which includes a plurality of parallel slots for supporting wafers.

13. The carrier of claim 11 wherein the slotted portions of the shell are distributed around 181 degrees to 330 degrees of the wafer circumference.

* * * * *